(12) United States Patent
Noujeim

(10) Patent No.: US 7,088,111 B2
(45) Date of Patent: Aug. 8, 2006

(54) ENHANCED ISOLATION LEVEL BETWEEN SAMPLING CHANNELS IN A VECTOR NETWORK ANALYZER

(75) Inventor: Karam Michael Noujeim, Sunnyvale, CA (US)

(73) Assignee: Anritsu Company, Morgan Hill, CA (US)

( * ) Notice: Subject to any disclaimer, the term of this patent is extended or adjusted under 35 U.S.C. 154(b) by 169 days.

(21) Appl. No.: 10/435,448

(22) Filed: May 9, 2003

(65) Prior Publication Data

US 2004/0222800 A1    Nov. 11, 2004

(51) Int. Cl.
  *G01R 27/28* (2006.01)
  *G01R 27/04* (2006.01)
  *G01R 13/14* (2006.01)

(52) U.S. Cl. .............. 324/650; 324/638; 324/71.15

(58) Field of Classification Search .............. 324/639, 324/650, 649, 637, 76.15, 76.38, 76.44, 76.45, 324/76.42, 638; 333/20, 24.2
See application file for complete search history.

(56) References Cited

U.S. PATENT DOCUMENTS

| | | | |
|---|---|---|---|
| 4,956,568 A | 9/1990 | Su et al. ................... 327/321 |
| 5,014,018 A | 5/1991 | Rodwell et al. ............. 333/20 |
| 5,072,189 A * | 12/1991 | Openlander ................. 324/638 |
| 5,119,035 A | 6/1992 | Goy et al. ................. 324/639 |
| 5,121,067 A * | 6/1992 | Marsland ................... 324/637 |
| 5,256,996 A | 10/1993 | Marsland et al. ............ 333/20 |
| 5,264,800 A | 11/1993 | Black ......................... 327/2 |
| 5,267,020 A | 11/1993 | Marsland et al. ........... 257/368 |
| 5,307,284 A | 4/1994 | Brunfeldt et al. .......... 364/485 |
| 5,352,627 A | 10/1994 | Cooper ...................... 435/379 |
| 5,378,939 A * | 1/1995 | Marsland et al. ............ 327/91 |
| 5,642,039 A * | 6/1997 | Bradley et al. .......... 324/76.53 |
| 6,064,694 A * | 5/2000 | Clark et al. ................ 375/224 |
| 6,066,953 A * | 5/2000 | Wadell ...................... 324/601 |
| 6,329,805 B1 | 12/2001 | Bracht et al. ............ 324/76.12 |
| 6,456,092 B1 * | 9/2002 | Arnold et al. .............. 324/639 |

* cited by examiner

*Primary Examiner*—Vincent Q. Nguyen
*Assistant Examiner*—Amy He
(74) *Attorney, Agent, or Firm*—Fliesler Meyer LLP

(57) ABSTRACT

A system and method for providing improved isolation between sampling channels in a vector network analyzer and sampling circuit. A vector network analyzer sampling channel includes a non-linear transmission line, an isolation device, a band-pass filter, and a sampler. The nonlinear transmission line receives a continuous-wave driving signal and generates a shockwave from which a pulse signal is generated. The pulse signal is used to gate the sampler and thus sample an RF signal. The isolation device and band-pass filter provide reverse isolation for RF signals traveling in the reverse direction within the channel and prevent RF signal leakage between vector network analyzer channels. The isolation device may include an isolator, amplifier or other reverse isolation device, and is used in conjunction with a band-pass filter. The band-pass filter is used to pass a frequency band for driving the non-linear transmission line. The stop-bands of the band-pass filter are used to prevent the RF leakage signal from reaching other sampling channels.

12 Claims, 3 Drawing Sheets

Prior Art

ENHANCED ISOLATION LEVEL BETWEEN SAMPLING CHANNELS IN A VECTOR NETWORK ANALYZER

CROSS REFERENCE TO RELATED APPLICATIONS

The present application is related to the following United States Patents and Patent Applications, which patents/applications are assigned to the owner of the present invention, and which patents/applications are incorporated by reference herein in their entirety:

U.S. patent application Ser. No. 10/439,563, entitled "Monolithic Non-linear Transmission Line and Sampling Circuit with Reduced Shockwave to Surfacewave Coupling", filed on Feb. 20, 2003, currently pending.

FIELD OF THE INVENTION

The current invention relates generally to vector network analyzers, and more particularly to non-linear transmission line-based sampling channel vector network analyzers.

BACKGROUND OF THE INVENTION

Vector Network Analyzers (VNA) are used to determine characteristics and parameters of network devices. A linear electrical network may be considered to consist of interrelated circuits or elements that have impedances and perform specific functions. For purposes of discussion, a network may be considered an electrical black box with one or more inputs or outputs. The network may be formed between the test device and a target device that may or may not be connected together by conductors. Measurements of microwave circuits and components involve the characterization of the circuit as a network, and measuring the reflection and transmission coefficients at the network ports.

The behavior of the network may depend on the network constants. Network elements may be passive and contain no energy source or sink besides normal ohmic losses, or be active and contain an energy source or sink. In operation, a signal that sweeps through a range of frequencies is applied to each port of a device under test (DUT). Both forward-transmission measurements and reverse-transmission measurements of a DUT are determined at each frequency in the range.

A simplified block diagram of a typical VNA 100 is illustrated in FIG. 1. VNA 100 includes an RF processing block 110, a signal processing block 120, and signal display block 130. The RF block 110 is coupled to a DUT 115. Signals are applied to the DUT, forward and reverse transmission characteristics are measured, and the characteristics are provided to the signal processing block 120. The signal processing block performs processing on the signals to clear up the signals and otherwise process them for subsequent presentation. The processed signals are then sent to signal display 130 wherein the signals may be displayed on a monitor. The RF block is a vital part of a VNA as the data obtained is used in the processing and display blocks.

In a sampler-based VNA, a signal is applied to a DUT. Data representing resulting transmission signals and reflection signals are then captured with a sampler. An example of a two port sampler-based RF block 200 of a typical VNA of the prior art is illustrated in FIG. 2. RF block 200 includes a signal generator 210, source resistance 211, pulse forming network 212, power splitter 220, samplers 231, 232, 233, and 234, and RF signal inputs 261 and 262. Attached to system 200 is DUT 250. Each of samplers 231–234 includes a strobe port, RF port, and an intermediate frequency (IF) port. As shown, one end of DUT 250 is connected to reference channel A 241 through sampler 231 and test channel A 242 through sampler 232. The other end of DUT 150 is connected to test channel B 243 and reference channel B 244. In operation, the pulse forming network 212 receives a signal from signal generator 210. In typical sampling-based RF blocks the prior art, the pulse forming network is implemented using step recovery diodes to generate pulses. The pulse forming network provides a pulse signal to power splitter 220. Typically, the pulse signal contains harmonics that may range from 0 to 65 GHz. Power splitter 220 splits the received pulse signal into four split pulse signals and distributes the split pulse signals to samplers 231–234. A frequency sweeping RF signal is then applied to one port of the DUT. In the embodiment shown, RF 1 may be applied to the DUT through port 261. RF 2 may be applied to the DUT through port 262. For each RF signal applied, the transmitted and reflected signals are sampled by the VNA samplers to generate intermediate frequency (IF) signals. For example, for an RF signal applied to the DUT from RF port 261, the forward transmission characteristics are sampled by sampler 233 connected to test channel B, and the reflection characteristics are sampled at sampler 232 corresponding to test channel A. The IF signal data for each sampler is then transmitted to the signal processing block from samplers 231–234 for further processing.

The VNA RF block 200 illustrated in FIG. 2 limits the VNA's dynamic range in that in the presence of highly reflective DUTs', RF signal power leakage from one test channel leaks into another channel via the power splitter. In particular, a portion of the RF signal power reflected by the DUT and received by sampler 2 leaks out of that sampler's strobe port and is received by the power splitter. A portion of the power received by the splitter finds its way into the strobe port of sampler 3, and eventually into the RF port of this sampler. This signal power leakage path is illustrated by the dotted line 260 in FIG. 2. Similarly, RF signal power leakage from the RF port of sampler 3 to the RF port of sampler 2 follows the same leakage path illustrated by the dotted line 260 in FIG. 2.

Typical isolators and amplifiers can not be used to reduce, isolate or prevent the forward and reverse transmission signals from propagating back through the sampler and power splitter from one channel to another channel because they are currently not available over the band of 0 to 65 GHz or greater. Typically, signal power leakage can not be calibrated out, and limits the dynamic range of the VNA and its ability to characterize accurately highly reflective device properties such as the stop bands of filters and diplexers.

What is needed is an improved RF reverse isolation block in a sampler based-VNA that overcomes the limitations of the prior art by increasing the isolation between VNA channels, and thus the VNA's dynamic range.

SUMMARY OF THE INVENTION

Isolation between test channels in a sampler-based VNA is improved by making use of reverse isolation devices and band-pass filters along with non-linear transmission lines. The non-linear transmission line for each sampler generates a shock-wave from which a pulse is generated. The generated pulse is used to gate the sampler, and thus sample characteristic RF waves of a DUT. The reverse isolation devices and band-pass filters prevent RF signals from leaking through the nonlinear transmission lines and into other channels. The non-linear transmission line, reverse isolation devices, and band-pass filters replace the central pulse generation network that feeds samplers in VNAs of the prior art. Using non-linear transmission lines along with reverse isolation devices and band-passed filters reduces RF leakage between test channels, and results in increased isolation between them. Reverse isolation devices may include amplifiers and isolators configured to operate in a small frequency band.

DETAILED DESCRIPTION

Isolation between test channels in a sampler-based VNA is improved by making use of reverse isolation devices and band-pass filters along with non-linear transmission lines. The non-linear transmission line for each sampler generates a shock-wave from which a pulse is generated. The generated pulse is used to gate the sampler, and thus sample characteristic waves of a DUT. The reverse isolation devices and band-pass filters prevent signals from traveling in a reverse direction along a channel. The non-linear transmission line, reverse isolation devices, and band-pass filters replace the central pulse generation network that feeds samplers in VNAs of the prior art. Using non-linear transmission lines along with reverse isolation devices and band-pass filters reduces port coupling between test channels, and results in increased isolation between them. Reverse isolation devices may include amplifiers and isolators configured to operate in a small frequency band.

Figure 1:
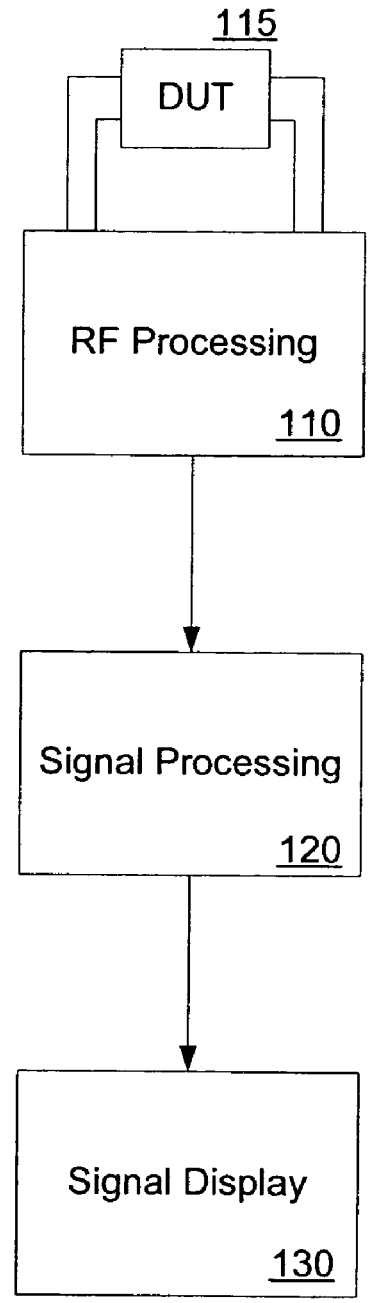
FIG. 1 is an illustration of a block diagram of a vector network analyzer.
Figure 2:
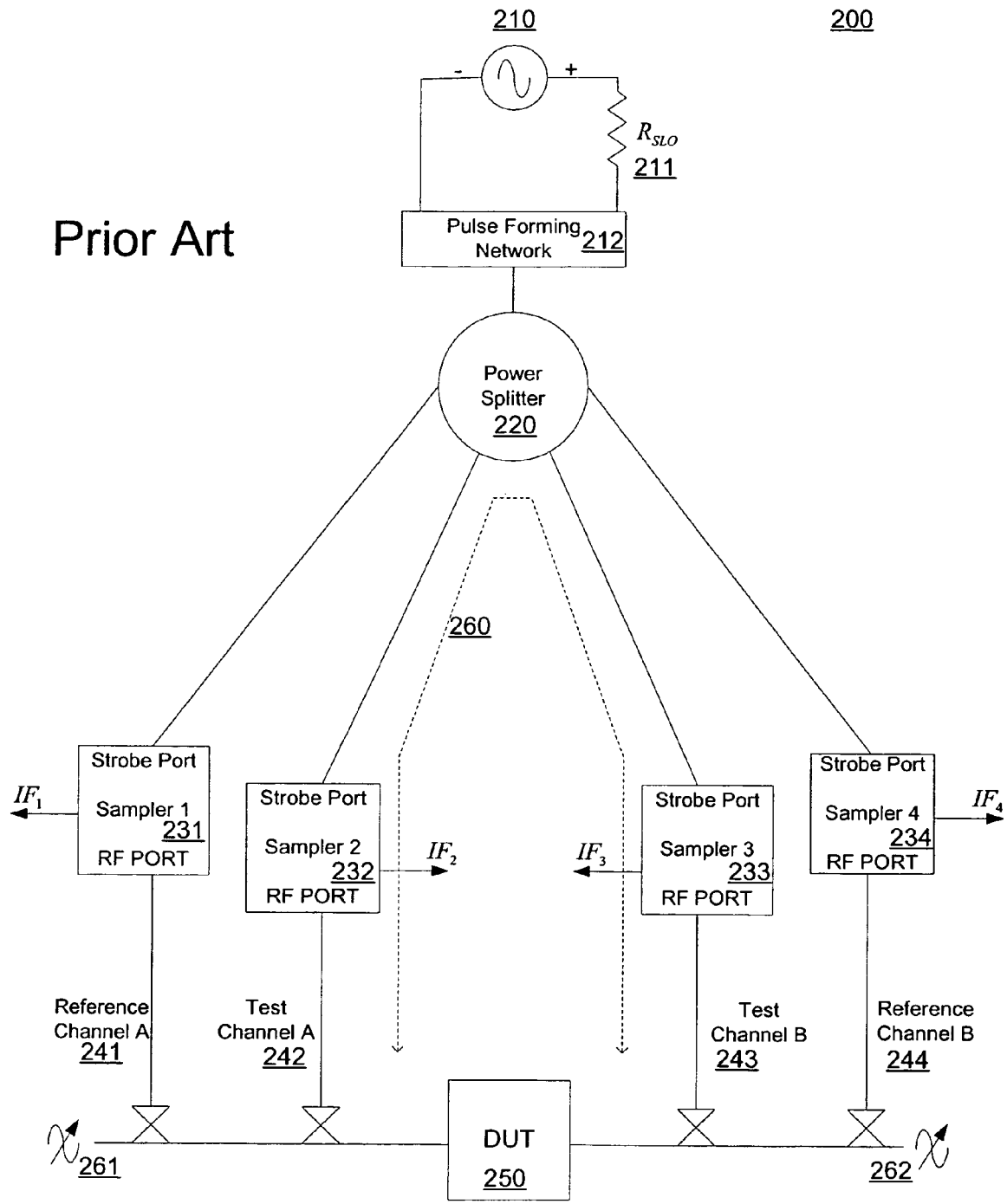
FIG. 2 is an illustration of an RF block of a vector network analyzer of the prior art.
Figure 3:
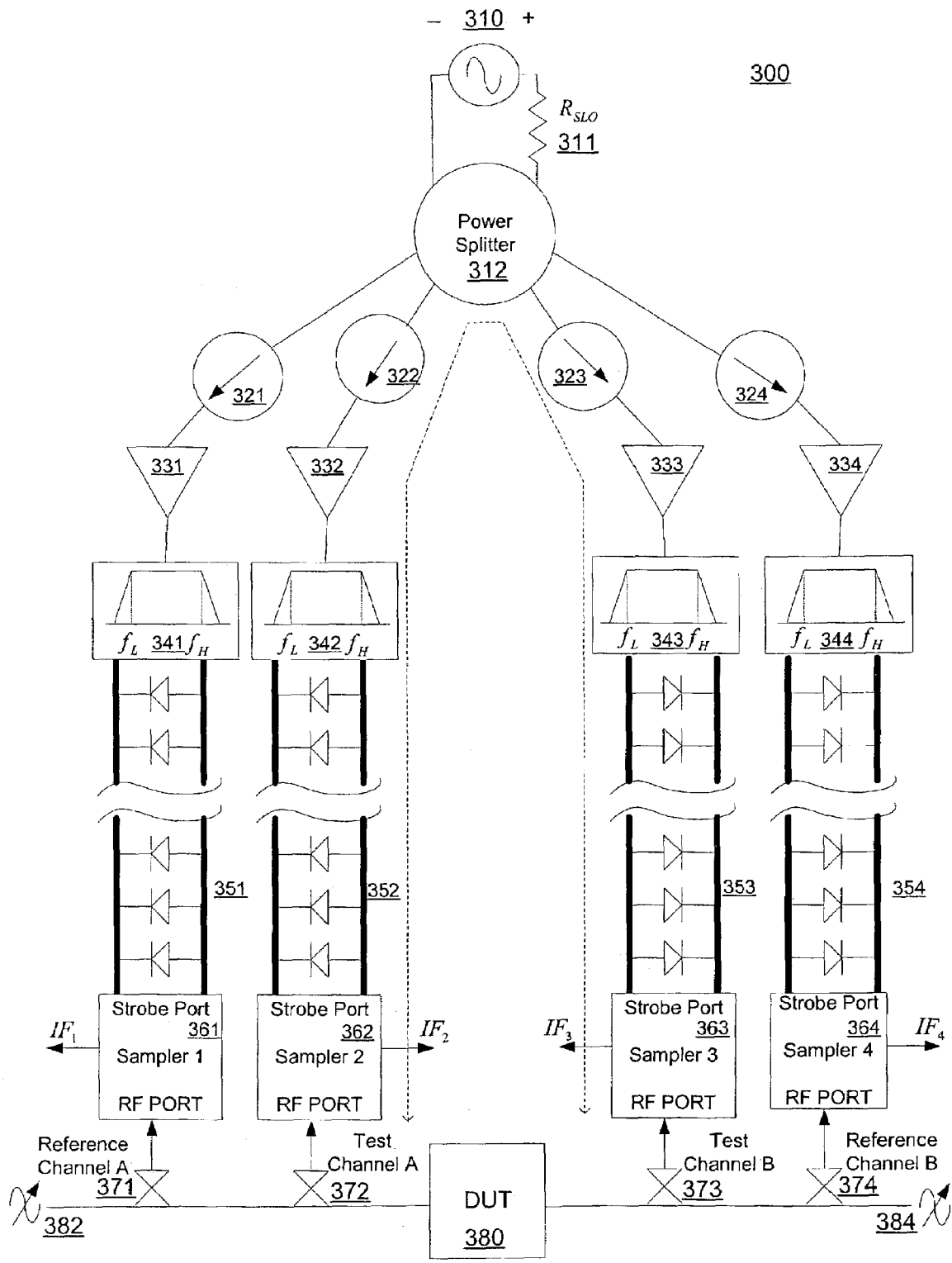
FIG. 3 is an illustration of an RF block of a vector network analyzer in accordance with one embodiment of the present invention.

An RF block 300 of a VNA in one embodiment of the present invention is illustrated in FIG. 3. RF block 300 includes signal generator 310, source resistance 311, power splitter 312, isolators 321–324, band-pass filters 341–344, optional amplifiers 331–334, nonlinear transmission lines 351–354, and samplers 361–364. Coupled to RF block 300 is DUT 380. The devices and components in different channels are approximately the same devices for balancing purposes.

In operation, signal generator 310 provides a source signal to power splitter 312 across load resistance 311. The power splitter 312 splits the source signal into separate signals for driving different test channel and reference channel samplers. Any number of channels could be used depending on the design of the particular VNA. In the embodiment shown, the source signal is split into four signals to drive two test channel samplers and two reference channel samplers. In one embodiment, each split signal may then be received by reverse isolation elements and a band-pass filter. The RF block reverse isolation elements illustrated include an isolator and amplifier arranged in series. However, the isolation elements may include any combination of isolators, amplifiers, or other reverse transmission limiting devices. The split signal for each channel then travels from the reverse isolation element through the band-pass filter to a non-linear transmission line.

In RF block 300, band pass filters 341–344 pass a signal of limited bandwidth between low frequency $f_L$ and high frequency $f_H$ to drive the non-linear transmission line, while rejecting RF power leakage signals falling outside this band.

The non-linear transmission line receives the split signal and generates a shockwave signal. The shockwave is generated as the received signal propagates along the transmission line. The shockwave is transformed into a pulse which is used to gate the sampler.

Concurrently to the generation of the shockwave signal, a frequency sweeping RF signal is applied to the DUT. In the embodiment shown, the frequency sweeping RF signal may be applied at ports 382, 384, or both. In response to the applied signal, the DUT generates a transmission signal and reflection signal. Each of the transmission signal and reflection signal are received by one of samplers 361–364. For example, for a frequency sweeping RF signal applied to the DUT through port 382, the sampler 362 coupled to test channel A 372 receives a reflection characteristic signal and sampler 363 coupled to test channel B 373 receives a transmission characteristic signal. Each sampler receiving one of the transmission signal or reflection signal from the DUT is driven by the pulses generated from the shockwaves of the non-linear transmission lines 351–354. An intermediate frequency (IF) signal comprising a series of sampled data is then generated and transmitted from each sampler as $IF_1$, $IF_2$, $IF_3$ and $IF_4$ is illustrated in FIG. 3.

Due to RF-to-STROBE port coupling in typical samplers, a portion of the received signal power propagates through the sampler and associated non-linear transmission line. Unlike the systems of the prior art, the VNA of the present invention significantly reduces and isolates the power leakage signals before they leak into other channels.

In one embodiment, channel isolation in the present invention is based on the use of reverse isolation elements and band-pass filters in a small band width of the source signal used to drive the non-linear transmission line. Reverse isolation devices in VNA channels are not practical in VNAs of the prior art because they can not be configured to cover the bandwidth of driving signals generated by the pulse forming network, typically a bandwidth from 0 to 65 GHz. Unlike VNAs of the prior art, the source signal frequency range required to drive the nonlinear transmission lines is small, typically between five and ten GHz. Isolators, amplifiers, and other reverse isolation devices are typically available in this reduced bandwidth.

A band pass filter is used between power splitter 312 and each of the non-linear transmission lines 351–354. The band pass filter is configured to reduce all signals outside a particular frequency range in which the nonlinear transmission line will be driven. Use of a band pass filter in this manner prevents RF signals falling outside the frequency band $f_L,f_H$ from leaking from the RF port of sampler 2 into the RF port of sampler 3 and vice versa.

In one embodiment, an isolator and a band-pass filter are used between power splitter 312 and each of non-linear transmission lines 351–354. The isolator is configured to allow signals falling inside the frequency band $f_L,f_H$ to travel along a single direction from power splitter 312 through the band-pass filter and into the non-linear transmission line. The band-pass filter is designed to block RF signals falling outside the frequency band $f_L,f_H$, while allowing RF signals falling inside this band to go through. As a result, RF signals falling above or below the frequency band $f_L,f_H$ and traveling through the power splitter from the RF port of sampler 2 to the RF port of sampler 3 will be blocked or greatly reduced. Similarly, RF signals falling above or below the frequency band $f_L,f_H$ and traveling through the power splitter from the RF port of sampler 3 to the RF port of sampler 2 will be blocked or greatly reduced. As discussed above, isolators may be configured to provide reverse isolation over a narrow bandwidth. In one embodiment, the narrow bandwidth may be within a range of 5–10 GHz, or some other suitably chosen frequency band. One or multiple isolators may be used to achieve a reverse isolation over a desired bandwidth.

In one embodiment, an amplifier and a band-pass filter are used between power splitter 312 and each of non-linear transmission lines 351–354. The amplifier is configured to allow signals falling inside the frequency band $f_L, f_H$ to travel along a single direction from power splitter 312 through the band-pass filter and into the non-linear transmission line. As a result, RF signals falling inside or outside the frequency band $f_L, f_H$ and traveling through the power splitter from the RF port of sampler 3 to the RF port of sampler 2 will be blocked or greatly reduced. Similarly, RF signals falling inside or outside the frequency band $f_L, f_H$ and traveling through the power splitter from the RF port of sampler 2 to the RF port of sampler 3 will be blocked or greatly reduced. Amplifiers that can be configured to allow signal transmission in one direction over a specified bandwidth are typically available. In one embodiment, the narrow bandwidth may be within a range of 5–10 GHz. In another embodiment, the narrow bandwidth may be some other suitably chosen frequency band that is considerably narrower than the bandwidth of 0 to 65 GHZ of previous systems. One or multiple amplifiers may be used to achieve this effect.

In one embodiment, multiple stages of band pass filters, isolators, and amplifiers may be used to reduce signal leakage between channels. Making use of multiple stages of isolation devices reduces further the RF signal leakage between channels and thus enhances the isolation achieved between them. Additionally, RF signal rejection may be achieved by using amplifiers and isolators which serve to reduce signals inside the pass band of the band-pass filter.

The enhanced level of isolation between test channels in the continuous wave-driven non-linear transmission line based sampling VNA results in a wider dynamic range. The transmission line is monolithic and outputs a shock wave upon receiving a continuous wave driving signal from splitter 312. Non-linear transmission lines are generally known in the field and shall not be discussed in detail herein. In one embodiment, the non-linear transmission line conductors and devices may be configured with a most desirable topology to reduce coupling as discussed in patent application Ser. No. 10/439,563, entitled "Monolithic Nonlinear Transmission Lines and Sampling Circuits with Reduced Shock-Wave-to-Surface-Wave Coupling", now U.S. Pat. No. 6,894,581. Detailed configuration of the non-linear transmission line may be varied according to the driving source signal, and implementation of the RF block and the non-linear transmission-line-driven samplers.

Isolation between test channels in a sampler based VNA is improved by making use of reverse isolation devices and band-pass filters in conjunction with non-linear transmission lines to generate sampling pulses. The non-linear transmission line for each sampler provides a shock-wave from which pulses are generated. The generated pulses are used to gate the sampler, and thus sample characteristic waves of a DUT. The non-linear transmission line replaces the central pulse generation network that feeds all resident samplers in VNAs of the prior art. Using non-linear transmission lines to implement the pulse generation along with reverse isolation elements and band-pass filters reduces the port coupling between test channels and thus increases the isolation between test channels. Additional band-pass filters, amplifiers, and isolators may be used to increase the isolation between test channels.

Other features, aspects and objects of the invention can be obtained from a review of the figures and the claims. It is to be understood that other embodiments of the invention can be developed and fall within the spirit and scope of the invention and claims.

The foregoing description of preferred embodiments of the present invention has been provided for the purposes of illustration and description. It is not intended to be exhaustive or to limit the invention to the precise forms disclosed. Obviously, many modifications and variations will be apparent to the practitioner skilled in the art. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. A radio-frequency sampling circuit comprising:
   a source driving signal input port;
   a non-linear transmission line configured to receive a source driving signal from said source driving signal input port;
   a sampler device coupled to said non-linear transmission line and configured to receive a pulse signal, the sampler configured to sample an RF signal as the sampler is driven by the pulse signal; and
   a reverse isolation circuitry coupled between said source driving signal input port and said non-linear transmission line, the reverse isolation circuitry comprising:
      a band-pass filter; and
      an amplifier, the amplifier and band-pass filter configured to pass frequencies corresponding to the source driving signal traveling from the source driving signal input port to the non-linear transmission line and provide reverse isolation to RF frequencies traveling from the RF port of the sampler through the nonlinear transmission line to the source driving signal port.

2. The radio-frequency sampling circuit of claim 1, wherein the reverse isolation circuitry further comprising an isolator; and the isolator and the band-pass filter configured to pass frequencies corresponding to the source driving signal traveling from the source driving signal input port to the non-linear transmission line and provide reverse isolation to RF frequencies traveling from the RF port of the sampler through the nonlinear transmission line to the source driving signal port.

3. The radio-frequency sampling circuit of claim 1 wherein the source driving signal has a bandwidth range at which an isolator or amplifiers is capable of providing reverse isolation.

4. The radio-frequency sampling circuit of claim 1 further comprising:
   the band pass filter connected between said source driving signal input port and said non-linear transmission line, the band pass filter configured to pass frequencies corresponding to the source driving signal.

5. A vector network analyzer comprising:
   RF sampling circuitry, the RF sampling circuitry including at least one channel, each of the at least one channel including:
      an isolation device;

a non-linear transmission line coupled to the isolation device; and wherein the isolation device includes an amplifier, the amplifier configured to pass a first range of frequencies traveling to the non-linear transmission line and provide reverse isolation to the first range of frequencies traveling from the non-linear transmission line; and a sampler coupled to the non-linear transmission line, the sampler configured to sample an RF signal, being driven by a pulse signal received from the non-linear transmission line, and transmit an intermediate frequency signal; and signal processing circuitry, the signal processing circuitry configured to receive the RF signal from said RF sampling circuitry.

6. The vector network analyzer of claim 5 wherein the first range of frequencies has a frequency range configured to drive the nonlinear transmission line.

7. The vector network analyzer circuit of claim 6 wherein the first range of frequencies is between 5 to 10 GHz.

8. The vector network analyzer of claim 5 wherein at least one channel includes:

a band pass filter coupled to the isolation device, the band pass filter configured to pass a first range of frequencies.

9. A method for providing a radio frequency sampler channel comprising:

receiving a source driving signal;

driving a non-linear transmission line with the source driving signal;

driving a sampler with a pulse signal, the sampler configured to sample an input RF signal and provide an intermediate frequency signal; and providing reverse isolation such that reverse RF signals traveling in a reverse direction as the source driving signal are reduced wherein providing reverse isolation includes providing an amplifier, the source driving signal passing through the amplifier before driving the non-linear transmission device.

10. The method of claim 9 further comprising:

providing a band pass filter, the band pass filter configured to pass a source driving signal frequency band within a predetermined range before the source driving signal drives the non-linear transmission line, the predetermined range of the source driving signal configured to drive the non-linear transmission line.

11. The method of claim 10 wherein the predetermined range is 5–10 GHz.

12. A method for providing a vector network analyzer comprising:

providing a radio frequency sampling circuitry, said providing RF frequency sampling circuitry including:

providing a reverse isolation device, wherein the reverse isolation device includes an amplifier;

providing a non-linear transmission line coupled to the isolation device; and providing a band pass filter, the band pass filter configured to pass a first frequency band to the non-linear transmission line, the first frequency band configured to drive the non-linear transmission line; and providing a sampler coupled to the non-linear transmission line, the sampler configured to sample an RF signal, be driven by a pulse signal received from the non-linear transmission line, and transmit an intermediate frequency signal; and providing signal processing circuitry, the signal processing circuitry configured to receive the intermediate frequency signal from the radio frequency sampling circuitry.

* * * * *